(12) United States Patent
Wolak et al.

(10) Patent No.: US 6,748,137 B2
(45) Date of Patent: Jun. 8, 2004

(54) LENSED OPTICAL FIBER

(75) Inventors: Edmund L. Wolak, Palo Alto, CA (US); Lei Xu, Richmond, CA (US); Robert Lang, Pleasanton, CA (US); Tae J. Kim, San Jose, CA (US)

(73) Assignee: JDS Uniphase Corporation, San Jose, CA (US)

( * ) Notice: Subject to any disclaimer, the term of this patent is extended or adjusted under 35 U.S.C. 154(b) by 103 days.

(21) Appl. No.: 09/915,186

(22) Filed: Jul. 24, 2001

(65) Prior Publication Data
US 2002/0159693 A1 Oct. 31, 2002

Related U.S. Application Data (60) Provisional application No. 60/291,949, filed on May 21, 2001, and provisional application No. 60/287,936, filed on Apr. 30, 2001.

(51) Int. Cl.[7] ............................................. G02B 6/25
(52) U.S. Cl. ................................... 385/33; 385/38
(58) Field of Search ............................. 385/31, 33, 34, 385/38, 43, 79, 35

(56) References Cited

U.S. PATENT DOCUMENTS

| | | | |
|---|---|---|---|
| 4,292,512 A | 9/1981 | Miller et al. | 250/205 |
| 4,803,361 A | 2/1989 | Aiki et al. | 250/227.24 |
| 4,934,784 A * | 6/1990 | Kapany et al. | 385/33 |
| 5,074,682 A | 12/1991 | Uno et al. | 385/93 |
| 5,455,879 A | 10/1995 | Modavis et al. | 385/33 |
| 5,485,481 A | 1/1996 | Ventrudo et al. | 372/6 |
| 5,500,911 A | 3/1996 | Roff | 385/33 |
| 5,940,557 A | 8/1999 | Harker | 385/33 |
| 6,415,087 B1 | 7/2002 | Yang et al. | |
| 6,456,429 B1 | 9/2002 | Wu | |

FOREIGN PATENT DOCUMENTS

| | | | |
|---|---|---|---|
| EP | 0294650 | 5/1988 | B24B/19/22 |
| EP | 0 465 230 A | 1/1992 | |
| EP | 0558230 | 2/1993 | G02B/6/255 |
| EP | 0971252 | 7/1999 | G02B/6/42 |
| EP | 1 160 600 A | 12/2001 | |
| JP | 63100654 | 4/1988 | G02B/6/42 |
| WO | WO 00/46622 | 1/2000 | G02B/6/36 |
| WO | WO 02/03112 | 7/2001 | G02B/6/10 |
| WO | WO 02/13339 | 8/2001 | H01S/3/094 |

* cited by examiner

Primary Examiner—Hung Xuan Dang (57) ABSTRACT

A microlens on the end of an optical fiber has reduced back reflections to a light source, such as a pump laser diode. In a particular embodiment, the microlens is lapped on two radii, at least one of which is offset from the center axis of the fiber, to form a point on the end of the fiber, thus reducing a surface for reflecting light back to the light source. In another embodiment, the microlens is formed with two different side surface angles to accommodate misalignment of the light source to the fiber mount. In another embodiment a Fresnel lens structure on the end of the fiber operates optically as an angled chisel lens.

54 Claims, 9 Drawing Sheets

LENSED OPTICAL FIBER

CROSS-REFERENCE TO RELATED APPLICATIONS

This U.S. patent application claims priority from U.S. Provisional Patent Application, serial No. 60/287,936 entitled TRACKING ERROR SUPPRESSION AND METHOD OF REDUCING TRACKING ERROR by Edmund Wolak, Tae Jin Kim, and Harrison Ransom, filed Apr. 30, 2001; and from U.S. Provisional Patent Application, serial No. 60/291,949 entitled ADVANCED LENS SHAPES FOR FIBER COUPLED LASERS WITH REDUCED FEEDBACK by Edmund L. Wolak, Lei Xu, and Robert Lang, filed May 21, 2001; the disclosures of which are hereby incorporated in their entirety for all purposes.

This U.S. patent application is being concurrently filed with U.S. patent application Ser. No. 09/915,184 entitled TRACKING ERROR SUPPRESSION AND METHOD OF REDUCING TRACKING ERROR by Edmund Wolak, Tac Jin Kim, Harrison Ransom, Jo Major, and Robert Lang; the disclosure of which is hereby incorporated in its entirety for all purposes.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

The present invention relates generally to optical fibers with a lens formed on an end of the optical fiber, and more specifically to a lensed optical fiber with improved optical coupling.

Optical fibers are used in a variety of optical telecommunications applications. They are commonly used for the transmission of information, such as data or voice information, over relatively long distances with high rates of transmission, commonly referred to as "bandwidth", and immunity from electronic noise. Optical fibers are also used in a wide variety of optical components, such as optical switches, tunable optical sources, optical amplifiers, and pump sources for optical amplifiers. An optical fiber "pigtail", or several optical fiber pigtails, is often provided so that an optical component can be connected to a transmission network. In some instances, the end of the optical fiber pigtail is fusion spliced (i.e. melted) to a fiber end of the network or another optical fiber pigtail. Other methods for joining fibers, such as by aligning them in close proximity in a capillary tube in a ferrule, are also known.

When an optical fiber pigtail is provided from a packaged optical component, the end of the optical fiber pigtail within the package typically is optically coupled to some other element or elements within the package. This optical coupling has been approached in a variety of ways. In one optical switching technique, the end of one fiber is physically moved across other fiber ends to be aligned with the fiber end desired by the switching function. Optical coupling occurs between fibers without any particular collimation or focusing of the light. The light on one fiber, which forms an optical waveguide having a core and a cladding, continues down the fiber aligned to the first.

Another approach is to expand the light from a fiber end into a light beam with a lens or lenses, and to manipulate that light beam in free space. For example, the light beam could be directed at a prism, optical filter, or mirror, and gathered by another lens or lenses to be focused onto the end of another optical fiber. This technique is commonly referred to as collimation. The collimation lenses are often nominally quarter-wave gradient-refractive-index ("GRIN") lenses that are relatively large and often require additional hardware, such as ferrules, to optically couple the optical fiber to the lens. Unfortunately, the size and characteristics of these lenses make them unsuitable for some applications.

For example, optical fiber amplifiers are typically coupled to a pump module. One type of pump module contains a semiconductor waveguide laser diode chip that emits light for pumping the optical fiber amplifier. The optical fiber amplifier is typically connected to the pump module with an optical fiber pigtail from the module. The other end of the optical fiber pigtail is placed in close proximity to the output of the laser diode chip to couple as much of the light from the laser diode chip as possible. It is generally desirable to put the end of the fiber in close proximity to the laser diode chip because light coming out of the laser diode chip disperses, reducing its intensity. The size of a conventional cylindrical GRIN lens makes it undesirable for this sort of application.

An alternative approach has been to shape the end of the fiber into a "microlens". One lens shape that has been used is a chisel lens. A chisel lens generally has two surfaces ground or lapped onto the end of the optical fiber so that a generally rounded line intersecting the optical axis of the fiber is formed. The resultant end of the fiber can operate as a lens to gather light from a source, such as a pump laser diode chip. Chisel lenses provide superior coupling compared to a cleaved fiber end, for example, but it is generally desirable to improve optical coupling, and further refinements to chisel lenses have been made. For example, chisel lenses have been formed at an angle to the optical axis of the fiber, as shown and discussed in U.S. Pat. No. 5,940,557 by Andrew Harker. Similarly, anti-reflective coatings have been added to fiber ends to reduce reflective loss and to reduce back-reflections into the pump laser diode or other element.

However, it is desirable to provide a lensed optical fiber with a microlens that enhances optical coupling and reduces reflection.

BRIEF SUMMARY OF THE INVENTION

The present invention is an optical fiber with a microlens formed on an end of the optical fiber. In one embodiment, a double-chisel lens is formed on the fiber end. This lens gathers light in both the slow and fast directions when coupling to a typical pump laser diode. In another embodiment, a pointed microlens is ground or lapped with centers offset from the central axis of the fiber. In an alternative embodiment, the lens is pointed by flat, rather than radiused, surfaces. In another embodiment, a fiber end is lensed in the fast and slow directions, in other words, doubly lensed, without forming a double chisel structure.

In a particular embodiment, a lensed optical fiber with a pointed microlens has a first surface with a first center of curvature offset from a center axis of the lensed optical fiber and a second surface having a second center of curvature also offset from the center axis of the fiber. A tangent line from the first surface at the point forms an angle of between about 176–156 degrees with a tangent line from the second surface at the point.

In another embodiment, a lensed optical fiber has a double-chisel lens. Each side of the lens has two chisel faces at a slight angle to each other and at least one is angled with respect to the center axis of the fiber, forming a ridge essentially from the tip of the lens back to the outer surface of the fiber. In one embodiment each chisel face is formed at a slight angle to the center axis and the tip is formed in the core portion of the fiber. Each of these chisel faces forms a ridge with corresponding opposing faces on the other side of the lens, such as with a conventional chisel lens, and this second ridge is essentially orthogonal to the ridges formed between chisel faces on each side of the lens.

The double chisel structure provides a cut-away portion for aligning the fiber close to a light source. In one embodiment, a section along one ridge through the tip of the lens is pointed, and along the other ridge through the tip is radiused. This structure reduces back reflections while providing lensing effect along both axes. Generally, the section through the intersection of the chisel faces and the tip is pointed and the orthogonal section is radiused. The radius of curvature is about 12–22 microns in one embodiment, and about 5–11 microns in another embodiment. In an alternative embodiment, the tip is not pointed, but is radiused with a radius of curvature of about 12–22 microns in one direction and about 5–11 microns in the orthogonal direction. In a particular embodiment, the smaller radius of curvature is in the plane defined by the ridges formed by the intersections of the chisel faces on each side.

In a further embodiment, the ridges in the horizontal direction in a double-chisel lens each form an angle of between about 2–12 degrees with a plane orthogonal to the center axis of the optical fiber. However, one angle is at least 1–3 degrees different than the other. This accommodates misalignment in the subassembly of the light source and laser mount by allowing the assembler to try both orientations (generally aligning these ridges in a horizontal or nearly horizontal orientation with respect to the surface of the substrate).

DETAILED DESCRIPTION OF THE INVENTION

I. Introduction

The present invention teaches various microlenses that can be formed on the end of an optical fiber. These microlenses provide reduced reflections into the source, which can reduce tracking error, improved optical coupling through enhanced light-gathering, and/or improved assembly methods.

II. Light Dispersion Patterns

Figure 1A:
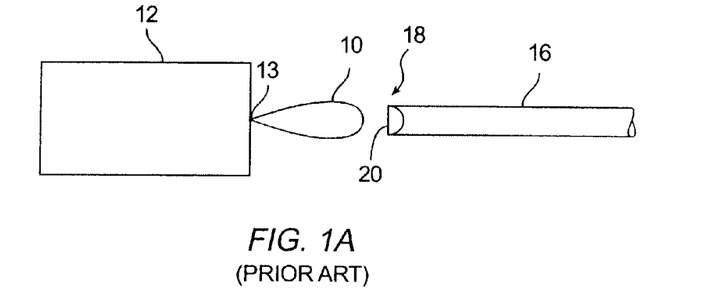
FIG. 1A is a simplified top view illustrating an emission pattern from a laser diode.
Figure 1B:
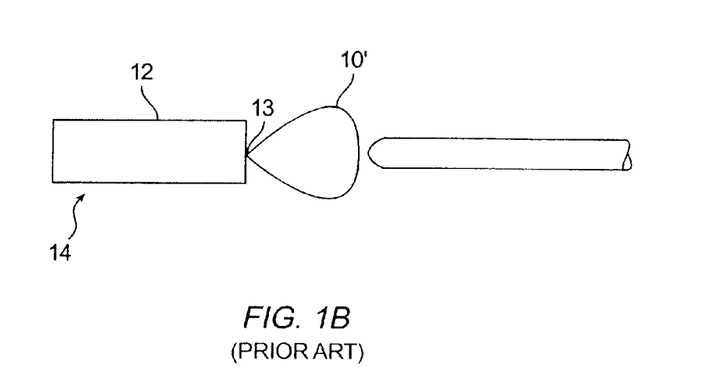
FIG. 1B is a simplified side view of the emission pattern from the laser diode of FIG. 1A.

FIG. 1A is a simplified top view of the light emission pattern 10 from a semiconductor laser diode chip 12, and FIG. 1B is a simplified side view of the light emission pattern 10' from an aperture 13 of the semiconductor laser diode chip. The light emission patterns are not the same in the horizontal and vertical directions. The light emission pattern 10 in the top view is along what is referred to as the "slow" axis, while the light emission pattern 10' in the side view is along what is referred to as the "fast" axis. These designations are chosen for purposes of discussion only, and assume that the laser diode chip has a relatively thin and wide waveguide structure that is oriented so that the wide edge of the waveguide core is essentially parallel to the base 14 of the chip.

A lensed optical fiber 16 with a conventional chisel lens 18 is mounted so that the edge 20 of the chisel lens is essentially parallel to the long dimension of the essentially rectangular aperture 13. Conventional chisel lenses form a lens along the axis that will gather the most light from one direction (the "fast" axis). While many useful devices have been fabricated with conventional chisel lenses, the inventor realized that reduced back reflection could be achieved and in some instances coupling efficiency could be improved with lens structures according to embodiments of the present invention.

III. Various Embodiments of Lensed Optical Fibers

Figure 2A:
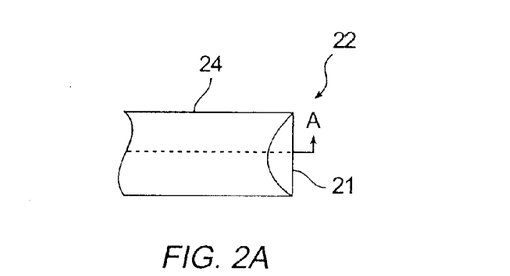
FIG. 2A is a simplified top view of a lensed optical fiber according to an embodiment of the present invention.

FIG. 2A is a simplified top view of a lens 22 on a fiber end according to an embodiment of the present invention. This lens provides high coupling efficiency and low feedback when used to couple light from a photonic component, such as a semiconductor light source, a semiconductor optical amplifier, a planar waveguide, an optical modulator, an optical switch, or other light source. This lens 22 is a chisel lens that is nominally symmetrical about the optical axis (i.e. center of the core) of the optical fiber 24 and has an edge 21 that comes to a point.

Figure 2B:
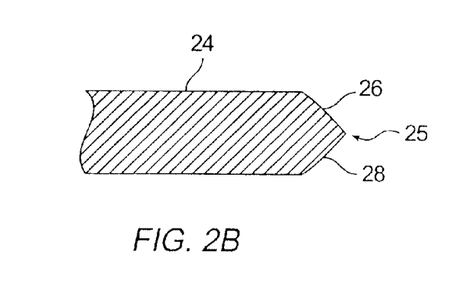
FIG. 2B is a simplified cross section of the lensed optical fiber of FIG. 2A illustrating a pointed chisel lens.

FIG. 2B is a section along A of the lens illustrated in FIG. 2A. The edge of the lens comes to a point 25 that is fabricated by lapping the fiber end at a radius offset from the center axis of the fiber on each side 26, 28 of the chisel lens. Although the edge of the chisel lens is shown as a straight segment in FIG. 2A, the edge could be curved or sharpened, as discussed below in relation to FIGS. 2F–2H and FIGS. 2J–2L, and FIGS. 2N–2R, the fiber end can be processed to form pointed end.

Figure 2C:
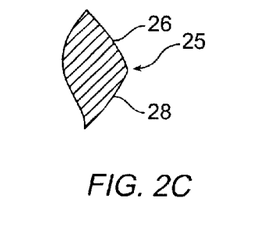
FIG. 2C is an enlarged portion of the cross section illustrated in FIG. 2B.

FIG. 2C is an enlarged view of the point 25. Lapping at offset radii avoids the formation of a locally "flat" spot at the end of the fiber. Although lapping on a radius that lies along the center axis, as is conventionally done, produces a lensed fiber end with a very small radius of curvature, even such a small curvature can provide a surface that looks locally relatively flat to a light beam. This "flat-ish" surface can reflect light back into a laser diode, for example, while the point produced according to this embodiment provides less reflection back into the waveguide (light source), even though the end of the lensed fiber is not a perfect point, that is to say, some softening of the point typically occurs due to the fabrication techniques. Other fabrication techniques, such as laser ablation, might be used to fabricate a pointed chisel lens.

Figure 2D:
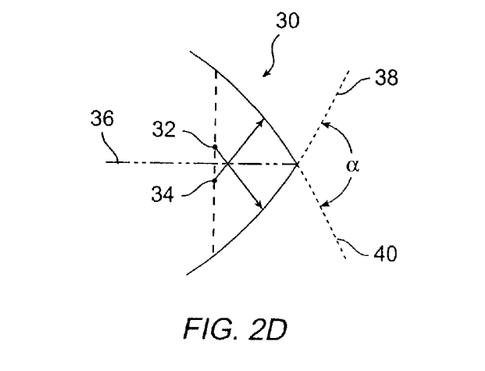
FIG. 2D is a diagram illustrating a pointed chisel lens with doubly offset radii.

FIG. 2D is a simplified diagram illustrating the configuration of a pointed chisel lens 30. The centers of curvature 32, 34 are each offset from the centerline 36 of the fiber forming a point 25. Alternatively, only one center of curvature is offset from the centerline. The tangent lines 38, 40 form an angle a of between about 176–156 degrees, which is exaggerated in this view for purposes of illustration. This and other embodiments of the present invention reduce ripple in the measured output power that can arise from a Fabry-Perot structure being formed between the light source and the fiber end. Reducing the ripple facilitates alignment, particularly automatic alignment, and can provide better frequency locking when used with external gratings.

Figure 2E:
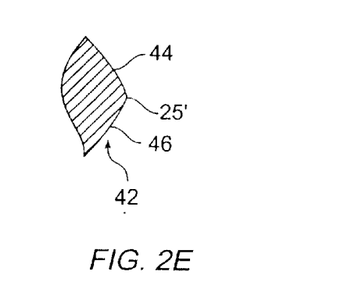
FIG. 2E is a simplified cross section of a pointed chisel lens with two different radii.

FIG. 2E is a simplified cross section of a pointed chisel lens 42 with offset lapping radii of different lengths. This produces lens surfaces 44, 46 with different curves, but the lens still comes to a point 25'.

Figure 2F:
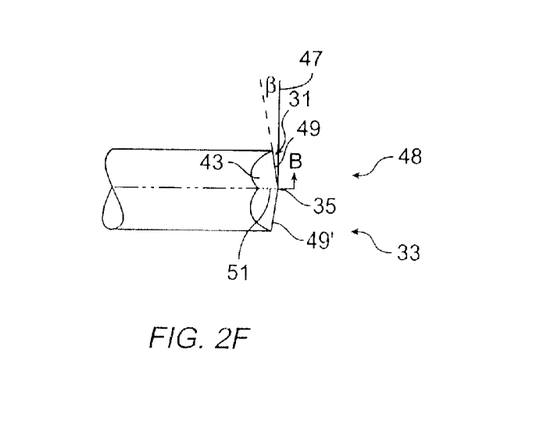
FIG. 2F is a simplified top view of a lensed optical fiber with a double chisel lens, according to another embodiment of the present invention.

FIG. 2F is a simplified top view of a double chisel lens 48. The term "double chisel" means that there are two angled chisel structures 31, 33 formed on the fiber end. Both chisel structures are angled with respect to a plane orthogonal to the center axis of the fiber and intersect to form a point 35. While the lens edge of the pointed chisel lens of FIG. 2A is pointed, the end of the double chisel lens comes to a "sharpened" point. In an alternate embodiment, one chisel is not angled and the other is. The point is preferably within or very near the core, and may be offset from the center of the core. The double chisel structure provides improved alignment tolerance because the cutaway portions of the fiber end avoid mechanical interference with the front facet of the source.

The terms "vertical" and "horizontal" are used for purposes of convenient discussion only and generally relate to the orientation of the fiber when mounted to a substrate, with the major plane of the substrate being essentially parallel to the horizontal axis.

The angle $\beta$ is about 2–12 degrees from a transverse plane 47 orthogonal to the center axis of the fiber and the lens edge 49 of the double-chisel lens 48 formed by the chisel faces (see FIG. 2G, ref. nums. 43, 45) of the first chisel structure 31. Having an angle greater than 2 degrees provides good feedback suppression, while an angle less than 12 degrees maintains good optical coupling to a laser diode.

Figure 2G:
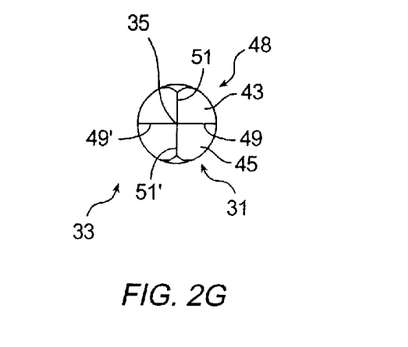
FIG. 2G is a simplified end view of the lensed optical fiber shown in FIG. 2F.

It is believed that the point 35 formed by the intersection of the two chisel structures 31, 33 provides some additional lensing action while reducing the flat area that might reflect light back into the source. The lens edges 49, 49' typically have a radius of 5–11 microns in a single-mode silica-based fiber, but could have a lesser or greater radius. In one embodiment, the radius of the first lens edge 49 is essentially the same as the radius of the second lens edge 49'. In another embodiment these radii are different The chisel faces 43, 45 of the first chisel structure 31 intersect the corresponding faces of the second chisel structure 33 to form the vertical ridge 51. In a particular embodiment, the vertical ridge 51 comes to a relatively sharp edge, typically with a radius of about 2 microns or less, but could be intentionally or incidentally rounded with a greater radius. The vertical ridges 51, 51' form a sharpened point 35 with the lens edges 49, 49'.

Figure 2H:
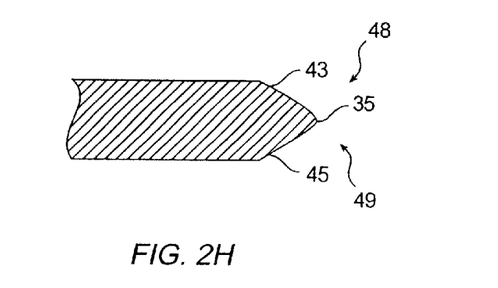
FIG. 2H is a simplified cross section of the lensed optical fiber shown in FIG. 2F.

FIG. 2G is an end view of the double-chisel lensed fiber end 48 shown in FIG. 2E showing the lens edges 49, 49' formed by the chisel faces 43, 45 of first chisel structure 31 and the vertical ridges 51, 51' forming the point 35. FIG. 2H is a section taken along the section line B showing the radiused nature of the lens edge 49 formed by chisel faces 43, 45 at the point 35 when viewed from this orientation. A section of the second lens edge (see ref. num. 49', FIGS. 2F, 2G) would be similarly radiused. Alternatively, the lens edge(s) could be pointed, in accordance with FIGS. 2A–2E, above.

Figure 2I:
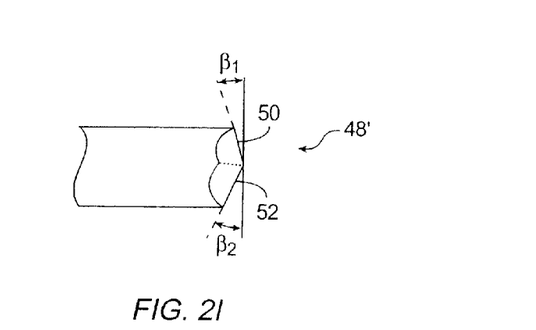
FIG. 2I is a simplified top view of another lensed optical fiber with a double chisel lens having coupling surfaces at two different angles from the center axis of the optical fiber.

FIG. 2I is a top view of an alternative embodiment of a chisel lens 48' on a fiber end with lens edges 50, 52 each at a different angle β1, β2 from a plane orthogonal to the center axis of the optical fiber. Both angles are between about 2–12 degrees, and the difference between angles (i.e. β1–β2) is between 1–3 degrees. This accommodates misorientation errors when fabricating the laser diode source assembly. For example, the laser diode might be misoriented 2 degrees from its desired orientation to the fiber when the laser diode is attached to the submount. The fiber can then be aligned with first one angle (e.g. α) on a side and then the other angle (β) on the side by flipping or rotating the fiber 180 degrees in the assembly tooling. The orientation that provides the best coupling to the laser diode can be selected and the fiber fixed in this position.

Lensed fibers are often mounted at an angle to a laser diode source and in close proximity, about 8–10 microns away from the emitting facet in some cases. As described in the preceding paragraph, one face of the lens can be oriented toward the laser diode for optimized coupling. The other face of the lens serves as cut-away relief so that the fiber end can be mounted close to the laser diode without physical interference between the components. Other types of microlenses, such as biconic lenses or single-chisel lenses with cut-away sides, could incorporate this feature.

Figure 2J:
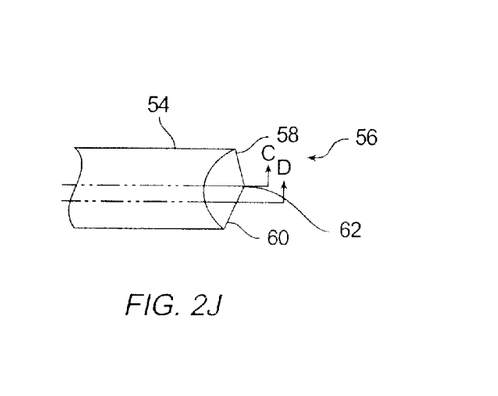
FIG. 2J is a simplified top view of a lensed optical fiber with a pointed chisel lens according to another embodiment of the present invention.
Figure 2K:
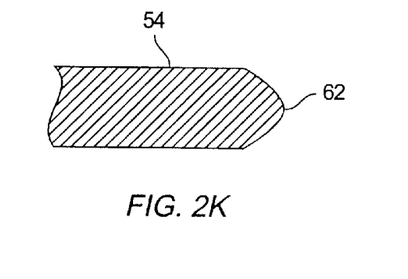
FIG. 2K is a first cross section of the lensed optical fiber shown in FIG. 2J taken along section line "A".
Figure 2L:
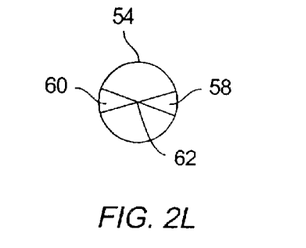
FIG. 2L is a simplified front view of the lensed optical fiber shown in FIG. 2J.
Figure 2M:
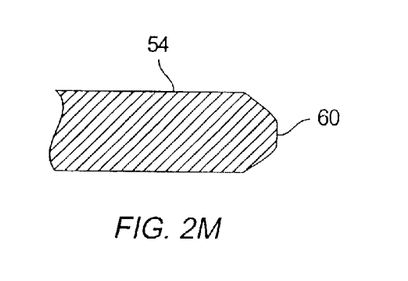
FIG. 2M is a second cross section of the lensed optical fiber shown in FIG. 2J taken along section line "B".

FIG. 2J is a simplified top view of a lensed fiber 54 with another chisel lens 56 according to an embodiment of the present invention. Two section lines, C, D shown in FIG. 2J are illustrated in FIGS. 2K and 2M, respectively. A front view is shown in FIG. 2L. This lens might be easier to fabricate than the similar lenses shown in FIGS. 2F and 2G.

A lensed fiber according to FIG. 2J is made by lapping a conventional chisel lens with a front edge (see FIG. 1A, ref. num. 20) and then grinding two facets 58, 60 to form a point 62 on the end of the fiber. The cross section of FIG. 2K shows a curved end formed by lapping about a radius along the center line of the fiber, but a pointed end, such as is discussed in relation to FIGS. 2C and 2E could also be fabricated. The chisel lens is formed along an axis that would extend in the vertical direction of FIG. 2J and into the paper in FIG. 2K, and the facets are formed in planes essentially orthogonal to the axis of the chisel lens. When mounted in an assembly, one of the faces provides cut-away relief for close assembly to a light source, while the other face forms a lens-like point with the first face to improve optical coupling in the slow direction and reduced reflections that could couple into a light source.

Figure 2N:
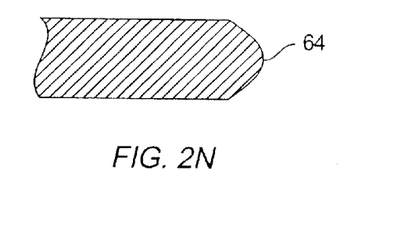
FIG. 2N is a simplified cross section of a doubly lensed optical fiber in the slow direction.
Figure 2O:
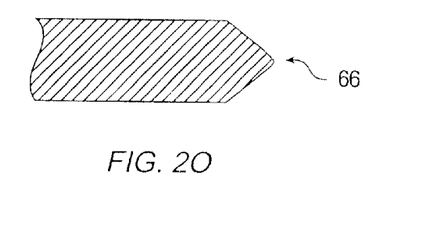
FIG. 2O is a simplified cross section of the doubly lensed optical fiber of FIG. 2N in the fast direction.

FIGS. 2N and 2O are simplified cross sections of a pointed double lensed fiber end illustrating different radii in the fast and slow directions. FIG. 2N represents a cross section of the lens structure for coupling in the slow direction with a radius forming the surface 64 of between about 12–22 microns. The surface of the lens shown in cross section in FIG. 2O comes to a point 66 from a radius of between about 5–11 microns. In a particular embodiment, the radius in the slow direction is about twice the radius in the fast direction. Alternatively, the point can be formed in the cross section of the slow direction (FIG. 2N). The fast and slow directions generally lie along orthogonal axes, and the doubly lensed fiber end is pointed on at least one of these axes.

Radii can be between about 12–22 microns in the slow direction and between about 5–11 microns in the fast direction, but these dimensions are only examples for an embodiment using a conventional laser diode chip and optical fiber. Suitable values for radii are chosen according to the far-field emission pattern of the light source that the lensed fiber is coupling to and other considerations, such as the index of refraction of the material that the lens is made of and the diameter of the core of the optical fiber, which in one example is about 6 microns.

Figure 2P:
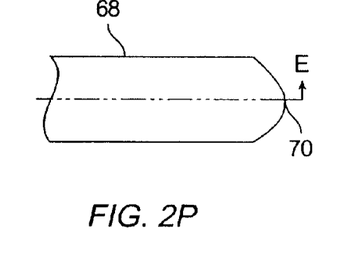
FIG. 2P is a simplified view of a lensed optical fiber with a pointed lens according to another embodiment of the present invention.
Figure 2Q:
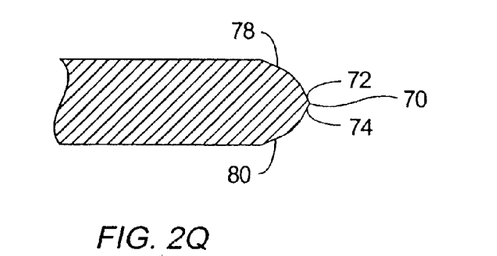
FIG. 2Q is a simplified cross section of the lensed optical fiber shown in FIG. 2P.
Figure 2R:
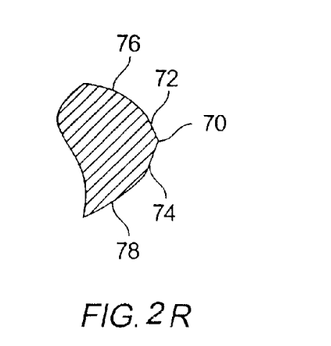
FIG. 2R is an enlarged portion of the cross section shown in FIG. 2Q illustrating facets forming a point on the end of the lensed optical fiber.

FIGS. 2P–2R illustrate another way to make a pointed chisel lens fiber. FIG. 2P is a top view of a lensed fiber 68 according to another embodiment of the present invention. FIG. 2Q is a cross section along section line E of FIG. 2P and FIG. 2R is an enlarged view of the fiber end illustrating a point 70 formed by cutting facets 72, 74 in the radiused surface 76 of the fiber end. This embodiment of a lensed fiber combines the relatively easy fabrication of a conventional chisel lens with a pointed lens having reduced reflective feedback. In one fabrication sequence, first facets 78, 80 are ground before lapping the radiused surface 76. Then, the lens is pointed by grinding the second facets 72, 74.

Figure 2S:
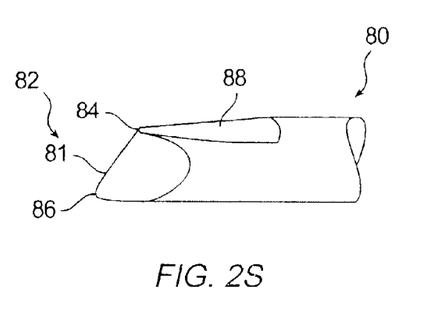
FIG. 2S is a simplified perspective view of an optical fiber with an angled chisel lens of varying section.

FIG. 2S is a simplified perspective view of a lensed optical fiber 80 according to another embodiment of the present invention with an angled chisel lens structure 82 having a varying radius along the chisel edge 81. The chisel edge forms an angle with the centerline of the optical fiber, generally between about 98–78 degrees, preferably between about 88–78 degrees, hence it is an "angled" chisel. In another embodiment, the angle between the major axis of the focusing structure (chisel edge) and the center axis of the optical fiber is between 75–89 degrees.

In a typical application the chisel edge 81 would lie essentially in a horizontal plane, as shown in FIG. 1A, but the fiber may be angled with respect to a laser diode or other light source. The radius 84 at one end is different than the radius 86 at the other end in a cylindrical embodiment. Other sectional shapes could be used to form the focusing structure on the chisel edge, such as a hyperbolic or a pointed shape, and both the shape and section could be varied. In a preferred embodiment a cutaway region 88 essentially truncates the chisel edge to provide clearance for aligning the fiber end close to a light source. The fiber may be angled with respect to the optical axis of the light source, with the end near the cutaway being placed closer to the source. The cutaway region allows the fiber end to be brought in close proximity to the light source.

In a preferred embodiment, the first radius (closer to the cutaway portion) is less than the second radius, which improves coupling efficiency by providing a larger radius of curvature of the lens further from the aperture of the laser diode or other light source, thus addressing the second order defocus that can occur with conventional angled chisel lenses. The radii 84, 86 chosen depend on several factors, such as the assumed proximity to the source, nature of the aperture, index of the lens material, fiber diameter, and core diameter. In a particular embodiment, with a single-mode, silica-based fiber having a mode field diameter of 6 microns, the first radius 84 is about 7–8 microns and the second radius 86 is about 9 microns, with the radius varying in an essentially continuous fashion from one end of the chisel edge 81 to the other. In another embodiment the larger radius is at least 1.1 times greater than the smaller radius, and in some embodiments 1.3 times greater.

Figure 2T:
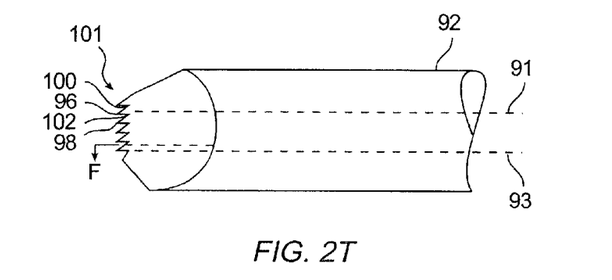
FIG. 2T is a simplified top view of an optical fiber with a Fresnel-type lens formed in the fiber end.

FIG. 2T is a simplified top view of a Fresnel-type chisel lens 90 on the end of an optical fiber 92. The core of the optical fiber is represented by dotted lines 91, 93. This type of lens avoids the lens tip getting too close to the facet of the laser diode when aligned in a source module. The Fresnel-type lens has a series of ridges 96, 98 and corresponding valleys 100, 102 formed on an edge 101 of a chisel structure. The ridges and valleys are very fine and at a fine pitch, typically much less than the core diameter, and are not drawn to scale, but are enlarged relative to the fiber for purposes of illustration.

The lens structure is "broken" into these ridges and valleys, which for purposes of discussion will be referred to a "lenslets", rather than angling a chisel lens. This avoids the variation in distance between one side of the lens structure and the other, compared to a conventional angled chisel lens. The ridges and valleys are made using laser ablation or diamond turning techniques. In a further embodiment, both the apexes of the ridges and the troughs of the valleys are radiused, with the radius of the troughs being greater than the radius of the apexes. In a particular embodiment the radius of the troughs is about 8 microns and the radius of the apexes is about 7 microns. Generally, the troughs have a radius of about 1.1–1.4 times the apexes.

It is generally desirable that the radii of each ridge closer to the facet or source are less than the radii of the troughs, which are further away. In one embodiment, the radii of all ridges are approximately equal and in other embodiments, the radii are different. For example, if the fiber is angled with respect to the light source, then it may be desirable to increase the radii of ridges further from the source. In an alternative embodiment, a Fresnel lens structure is formed on the face of an optical fiber without lapping the fiber end to form a chisel structure. The Fresnel lens is designed to emulate the optical characteristics of an angled chisel lens.

Figure 2U:
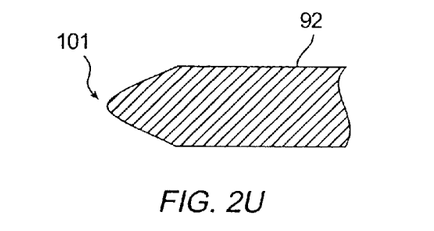
FIG. 2U is a simplified cross section of the lensed fiber shown in FIG. 2T.

FIG. 2U is a simplified cross section of the lens shown in FIG. 2T taken along the section line F showing the radiused edge 101 of the chisel structure.

Figure 2V:
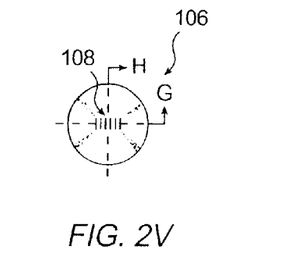
FIG. 2V is a simplified front view of a lensed fiber according to an embodiment of the present invention.
Figure 2W:
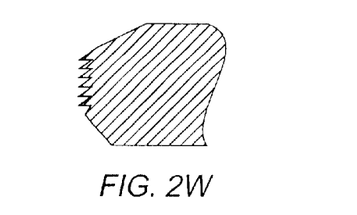
FIG. 2W is a simplified cross section of the lensed fiber shown in FIG. 2V.
Figure 2X:
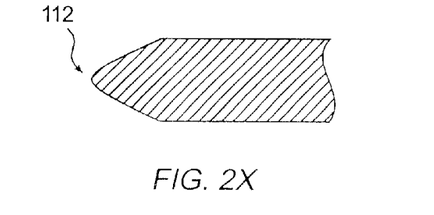
FIG. 2X is simplified cross section of the lensed fiber shown in FIG. 2V along another plane.

FIG. 2V is a simplified front view of a binary lens 106 according to another embodiment of the present invention. A series of binary lenslets 108 have been formed along the tip of the lens. The shape of the lens is similar to an elongated truncated pyramid. FIG. 2W is a simplified cross section taken along section line G and FIG. 2X is a simplified cross section taken along section line H showing the radiused nature of the tip 112.

Figure 2Y:
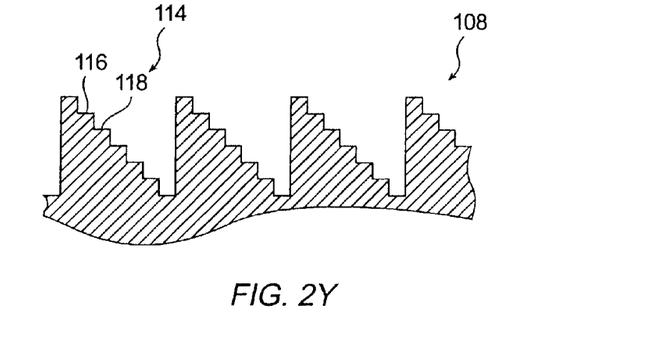
FIG. 2Y is a simplified cross section of a binary lens structure according to an embodiment of the present invention.

FIG. 2Y is a simplified cross section of the series of lenslets 108 showing how the lenslets 114 are made up of a series of steps 116, 118. These stepped lenslets operate similarly to the lenslets in the Fresnel-lensed fibers with straight-faced lenslets shown in FIGS. 2T and 2U. These binary lenslets may provide easier fabrication than the straight-faced lenslet.

IV. Biconic Lenses

Figure 3A:
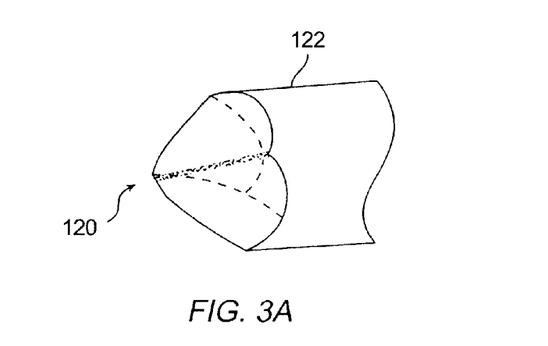
FIG. 3A is a simplified end view of an offset biconic lens according to another embodiment of the present invention.
Figure 3B:
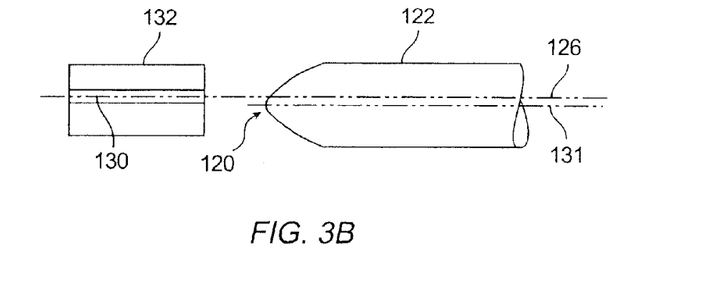
FIG. 3B is a simplified plan view of an optical fiber with an offset biconic lens in relation to a light source.
Figure 3C:
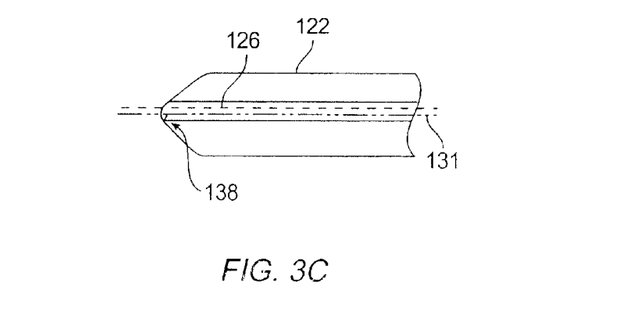
FIG. 3C is a simplified top view of an offset biconic lens according to an embodiment of the present invention.

FIG. 3A is a simplified perspective view of an offset biconic lens 120 on a fiber end 122 according to another embodiment of the present invention. FIGS. 3B and 3C illustrate how the biconic lens has been formed so that the center of curvature 124 of the lens is offset from the center 126 of the core 128 of the fiber. FIG. 3B is a plan view illustrating the axis 130 of a laser diode source 132 nominally aligned with the center 126 of the core of the fiber end 122. The drawing is not to scale in order to illustrate the fiber end more clearly. The center of curvature of the lens 120 lies along a line 131 offset from the center 126. FIG. 3C is a top view of the fiber end 122 and the biconic lens 120 illustrating the offset of the center of curvature 138 from the center axis 126 of the core of the fiber. The center of curvature lies along the offset line 131. In a particular embodiment, the curvature in the top view elevation axis is picked to match the divergence of light coming out of the laser. This lens is an anamorphic lens, i.e. it provides different powers at different axes of the lens.

Figure 3D:
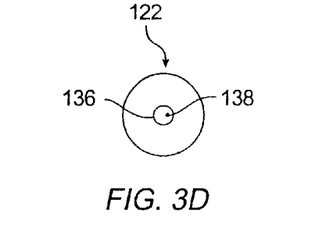
FIG. 3D is a simplified front view of an offset biconic lens.

FIG. 3D is an end view of the fiber end 122 illustrating the core of the fiber as a circle 136 and the center of curvature 138 of the biconic lens. In a particular embodiment, the core has a diameter of about 6 microns and the center of curvature of the biconic lens is offset from the center of the core about 2 microns with a 15 micron radius for the slow arc and an 8 micron radius for the fast arc. Other dimensions might be appropriate for other types of fibers. Generally speaking, offsets in the range of ⅓ to ⅔ of the mode field diameter are preferred.

Figure 4A:
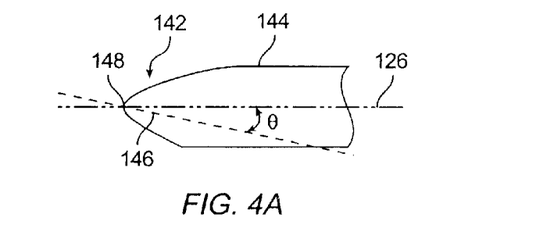
FIG. 4A is a simplified cross section of an angled biconic lens according to an embodiment of the present invention.
Figure 4B:
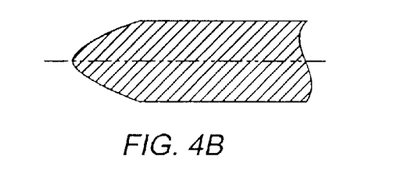
FIG. 4B is a simplified cross section of the angled biconic lens shown in FIG. 4A along another section.
Figure 4C:
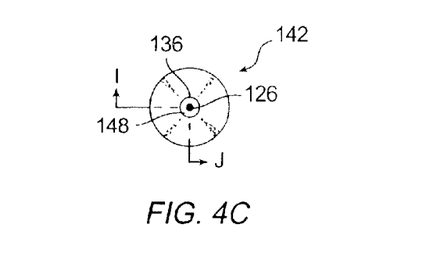
FIG. 4C is a simplified front view of the angled biconic lens of FIGS. 4A and 4B.

FIG. 4A is a simplified section of an angled biconic lens 142 on an optical fiber end 144. Hashing lines are omitted in this sectional view for clarity of illustration. Referring to FIG. 4C, this section is taken along section line I. The angled biconic lens 142 is formed at an angle θ from the centerline 126 of the fiber 144. This gives the lens a somewhat "bent" appearance from this view in relation to the fiber. FIG. 4B is a simplified section taken along section line J, showing that the angled biconic lens can have a "straight" orientation in this view. While the angled biconic lens could be angled on both axes, angling on one axis is desirable to reduce backreflections into a light source, while providing good coupling efficiency. The angle θ between the center axis of the fiber 126 and the center axis of the lens 146 is generally between about 2–12 degrees. In one embodiment, the center axis of the lens intersects the center axis of the fiber at the tip 148 of the lens, although in other embodiments the tip of the lens might not be on the centerline of the fiber, but it is generally desirable to have the tip within the core portion of the fiber.

FIG. 4C is a simplified front view of the angled biconic lens 142 illustrated in FIGS. 4A and 4B, showing the tip of the lens 148 lying on the center of the fiber 126, which is generally in the center of the core 136.

V. An Exemplary Optical Component

Figure 5:
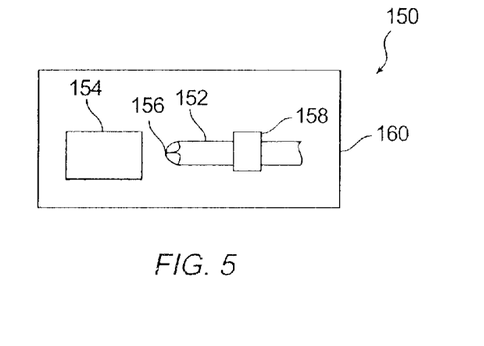
FIG. 5 is a simplified top view of a portion of a pump module with a lensed optical fiber according to an embodiment of the present invention.

FIG. 5 is a simplified top view of a portion of an optical component 150 with a lensed optical fiber 152 configured to couple to a light source 154 according to an embodiment of the present invention. The light source 154 could be a semiconductor light source, a semiconductor optical amplifier, a planar waveguide, an optical switch, an optical modulator, or other light source. The microlens 156 on the end of the lensed optical fiber 152 could be any of the types discussed above in relation to FIGS. 2A–2Y, 3A–3D, and 4A–4C, and certain combinations thereof. Certain types of lenses might be particularly desirable for certain applications. For example, in an application where minimal back reflection is desired and ease of fabrication of the microlens is a greater concern than light gathering, a lens according to FIGS. 2A–2C might be used. In an application where maximum light gathering is more of a concern than fabrication, a lens in accordance with FIG. 2F might be chosen. A lensed fiber according to FIGS. 2J–2M might provide a desirable compromise between ease of fabrication and improved lensing action. Similarly, if the lensed fiber is to be mounted in close proximity at an angle to the light source and accommodation for mis-alignment is desired, a fiber in accordance with FIG. 2I might be chosen.

The light source and fiber mount 158, which holds the optical fiber 152, are typically mounted on a substrate or submount 160, and then attached to the base of a package (not shown), and sealed in the package with a can or lid (not shown). The light source is aligned to the fiber mount so that when the component is assembled, the optical fiber can be placed in the fiber mount and adjusted, typically to achieve maximum optical coupling between the optical fiber and the light source; however, other parameters, such as reflected light or polarization could be minimized or balanced.

The fiber mount holds the fiber relatively securely while allowing the assembler to slide the fiber toward and from the light source, and typically allows rotating the fiber. Once the fiber has been aligned, it is secured in the fiber mount with solder or adhesive, such as hot-melt, acrylate, or epoxy glue. The fiber is often brought out through a metal tube, commonly called a "snout". Solder or other sealant is applied to form a seal between the fiber and the snout, or the snout is compression-fit to the fiber. Finally, a flexible cover (not shown) is often placed over the fiber and outer portion of the snout to provide further support and strain relief.

V. An Exemplary Assembly Process

Figure 6:
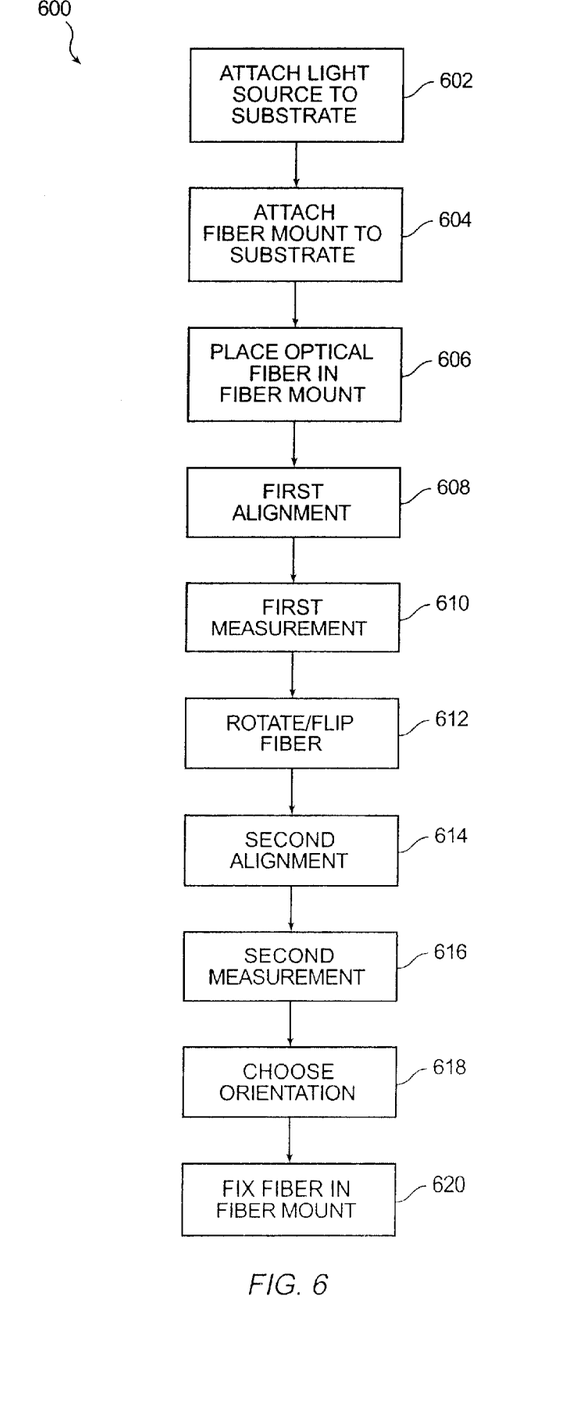
FIG. 6 is a simplified flow chart of a process for aligning a lensed optical fiber to a light source.

FIG. 6 is a simplified flow chart of a process 600 for assembling an optical component according to an embodiment of the present invention. A light source is attached to a substrate (step 602) and a fiber mount is also attached to the substrate and submount (step 604). While the fiber mount is typically carefully aligned to the light source, some misorientation, often about 1–3 degrees, can occur.

A lensed optical fiber is placed in the fiber mount (step 606) and the lensed optical fiber is aligned with respect to a light source in a first orientation (step 608) and the coupling efficiency is measured (step 610). The lensed optical fiber has a microlens on the end of the fiber with portions removed on either side of the central axis of the fiber at different angles, as shown in FIG. 2I. However, it is not necessary for the removed portions to meet in the center of the fiber. In other words, the end of the fiber could be a truncated point, with the lens structure in the horizontal direction extending a small distance on one or both sides from the center axis.

The removed portions provide clearance for aligning the lensed fiber to a light source, such as a photo diode. The side of the microlens formed by the removed portion also presents a coupling surface to the light source. Each side of the microlens would present a coupling surface at a different angle if the fiber was rotated or "flipped" 180 degrees in its mounting. Thus, the optical coupling between the light source and the optical fiber through the microlens can often be varied by flipping the microlens from one side to the other.

The fiber is typically aligned at an angle (i.e. the center axis of the fiber is at an angle to the center axis of the light source), or could be offset, or both. In addition to providing a cut-away relief, the removed portions can also form a lens structure at the point or at each corner of a truncated point. Coupling efficiency is usually determined by turning on the laser diode and manipulating the fiber to achieve a maximum power level out of the fiber. The fiber is typically moved toward and from the light source, as well as slightly rotated, typically less than 90 degrees for a chisel lens, while measuring the light intensity carried by the fiber.

The fiber is then rotated 180 degrees (step 612) to flip the sides of the microlens and aligned to the light source a second time (step 614) and measured (step 616). If superior coupling efficiency was achieved in the first alignment, then the fiber is rotated 180 degrees again, aligned to the light source, and fixed in position, such as by soldering or gluing the fiber to the fiber mount. If superior coupling efficiency was achieved in the second alignment, then the fiber is fixed in that position. In other words, the preferred alignment is chosen (step 618) according to the results achieved in the alignment steps, and the fiber is fixed in the chosen orientation (step 620). As discussed above in relation to FIG. 2I, a microlens with side facets at two different angles from the center axis of the optical fiber can accommodate angular misalignment between the light source and the fiber mount.

While the invention has been described in conjunction with several specific embodiments, it is evident to those skilled in the art that many farther alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A lensed optical fiber comprising:
   a pointed microlens having
      a first surface with a first center of curvature offset from a center axis of the lensed optical fiber, and
      a second surface with a second center of curvature; the first surface intersecting the second surface to form a point.

2. The lensed optical fiber of claim 1 wherein the point lies on the center axis of the lensed optical fiber.

3. The lensed optical fiber of claim 1 wherein the point is offset from the center axis of the lensed optical fiber.

4. The lensed optical fiber of claim 1 wherein the second center of curvature is offset from the center axis of the lensed optical fiber.

5. The lensed optical fiber of claim 1 wherein a first tangent line from the first surface at the point and a second tangent line from the second surface at the point form an angle of between about 176–156 degrees.

6. The lensed optical fiber of claim 1 wherein the pointed microlens comprises a pointed edge.

7. The lensed optical fiber of claim 6 wherein the pointed edge comprises a curved edge.

8. The lensed optical fiber of claim 1 wherein the pointed microlens comprises a sharpened point.

9. The lensed optical fiber of claim 1 wherein the pointed microlens is doubly lensed.

10. A lensed optical fiber comprising:
    a pointed microlens having
       a first surface with a first center of curvature offset from a center axis of the lensed optical fiber, and
       a second surface with a second center of curvature offset from the center axis of the lensed optical fiber, the first surface intersecting the second surface to form a point so that a first tangent line from the first surface at the point and a second tangent line from the second surface at the point form an angle of between about 176–166 degrees.

11. A lensed optical fiber comprising:
    a fiber end
    a pointed doubly lensed microlens formed on the fiber end, the pointed doubly lensed microlens including
       a first lens structure formed on a first axis, and
       a second lens structure formed on a second axis, wherein at least one of the first lens structure and the second lens structure comes to a point.

12. The lensed optical fiber of claim 11 wherein the first axis is essentially orthogonal to the second axis.

13. The lensed optical fiber of claim 11 wherein the first lens structure has a first radius and the second lens structure has a second radius, the second radius being twice the first radius.

14. The lensed optical fiber of claim 11 wherein the first lens structure has a first radius between about 5–11 microns and the second lens structure has a second radius between about 12–22 microns.

15. The lensed optical fiber of claim 14 wherein the first lens structure is pointed.

16. The lensed optical fiber of claim 14 wherein the second lens structure is pointed.

17. A pointed doubly lensed optical fiber comprising:
    a first lens structure with a first lens edge having a first radius of curvature between about 12–22 microns;

a second lens structure with a second lens edge having a second radius of curvature between about 5–11 microns, the first lens edge being essentially orthogonal to the second lens edge, wherein at least one of the first lens edge and the second lens edge is pointed.

18. A lensed optical fiber comprising:
a pointed microlens having
a chisel lens having an edge along an axis,
a first side facet formed in a first plane essentially orthogonal to the edge of the chisel lens, and
a second side facet formed in a second plane essentially orthogonal to the edge of the chisel lens, the first side facet intersecting the second side facet to form a point.

19. A lensed optical fiber comprising:
a double-chisel lens having
a first chisel structure formed on a first side of the double chisel lens, and
a second chisel structure formed on a second side of the double chisel lens, the first chisel structure intersecting the second chisel structure to form
a ridge separating the first side of the double chisel lens from the second side of the double chisel lens.

20. The lensed optical fiber of claim 19 wherein a chisel edge of the first chisel structure has a radius of curvature of between about 12–22 microns.

21. The lensed optical fiber of claim 19 wherein a chisel edge of the first chisel structure has a radius of curvature of between about 5–11 microns.

22. The lensed optical fiber of claim 19 wherein a first chisel edge of the first chisel structure forms a first angle of about 2–12 degrees with a transverse plane orthogonal to a center axis of the lensed optical fiber.

23. The lensed optical fiber of claim 22 wherein a second chisel edge of the second chisel structure forms a second angle of about 2–12 degrees with the transverse plane.

24. The lensed optical fiber of claim 23 wherein the first angle is different from the second angle by between about 1–3 degrees.

25. The lensed optical fiber of claim 23 wherein the first chisel edge and the second chisel edge lie in a plane.

26. A lensed optical fiber comprising:
a double-chisel lens having
a first chisel structure with a first chisel edge forming a first angle between 2–12 degrees with a transverse plane orthogonal to a center axis of the lensed optical fiber, and
a second chisel structure with a second chisel edge forming a second angle between 2–12 degrees with the transverse plane, wherein the first angle is different from the second angle by about 1–3 degrees.

27. A lensed optical fiber comprising:
a double-chisel microlens having
a first surface forming a first angle between about 2–12 degrees with a plane orthogonal to a center axis of the lensed optical fiber; and
a second surface forming a second angle between about 2–12 degrees with the plane orthogonal to the center axis of the lensed optical fiber, the second angle being different from the first angle by between about 1–3 degrees.

28. A method of assembling an optical component, the method comprising:
attaching a light source to a substrate;
attaching a fiber mount to the substrate;
placing an optical fiber with a microlens in the fiber mount in a first orientation;
aligning the optical fiber in the first orientation to couple light from the light source to the microlens;
measuring the light coupled to the optical fiber; then
rotating the optical fiber essentially 180 degrees about a center axis of the optical fiber to a second orientation;
aligning the optical fiber in the second orientation to couple light from the light source to the microlens; then
measuring the light coupled to the optical fiber; then
selecting a preferred orientation from the first orientation and the second orientation; and
mounting the optical fiber in the preferred orientation in the fiber mount.

29. The method of claim 28 further comprising a step, prior to the step of attaching the light source to the substrate, of attaching the light source to a submount, and wherein the step of attaching the light source to the substrate comprises attaching the submount to the substrate.

30. A lensed optical fiber comprising:
an offset biconic lens having
a center of curvature of a first axis of the offset biconic lens offset from a centerline of the lensed optical fiber.

31. The lensed optical fiber of claim 30 wherein the center of curvature is offset from the centerline by ⅓–⅔ of a mode field diameter.

32. The lensed optical fiber of claim 30 wherein the center of curvature is offset from the centerline by about 1–5 microns.

33. A lensed optical fiber comprising:
an angled biconic lens having
a first lens axis angled to a centerline of the lensed optical fiber at an angle of between about 2–12 degrees.

34. The lensed optical fiber of claim 33 wherein the first lens axis intersects the centerline at a surface of the lens.

35. The lensed optical fiber of claim 33 wherein the first lens axis intersects a surface of the lens within a core region of the lensed optical fiber.

36. The lensed optical fiber of claim 33 further comprising a second lens axis of the angled biconic lens, the second lens axis being congruent with the centerline of the lensed optical fiber.

37. A lensed optical fiber comprising:
an angled chisel lens having
a first radius of curvature at a first end of a chisel edge, and
a second radius of curvature at a second end of the chisel edge, the first radius being different from the second radius.

38. The lensed optical fiber of claim 37 wherein the chisel edge transitions from the first radius to the second radius in a continuous fashion.

39. The lensed optical fiber of claim 37 wherein the second radius of curvature is designed to collimate light from the source with a working distance that is longer than the first radius.

40. The lensed optical fiber of claim 37 further comprising a cutaway region, the first end of the chisel edge being proximate to the cutaway region and the first radius of curvature being less than the second radius of curvature.

41. The lensed optical fiber of claim 37 wherein the second radius of curvature is about 10–30% greater than the first radius.

42. The lensed optical fiber of claim 37 wherein the first radius is between 7–8 microns and the second radius is at least 1.1 times the first radius.

43. The lensed optical fiber of claim 37 wherein the chisel edge is cylindrical.

44. A lensed optical fiber comprising:
an angled chisel lens having
a first radius of curvature at a first end of a chisel edge, the first end of the chisel edge being proximate to
a cutaway portion of the lensed optical fiber, and
a second radius of curvature at a second end of the chisel edge, the second radius of curvature being at least 1.1 times greater than the first radius of curvature.

45. A microlens integrally formed on an optical fiber, the microlens comprising:
an angled chisel lens with
a chisel edge having a major axis of a focusing structure forming an angle with a center axis of the optical fiber, the focusing structure having
a first sectional profile at a first end of the chisel edge, and
a second sectional profile at a second end of the chisel edge.

46. The microlens of claim 45 wherein the angle is between about 78–98 degrees.

47. The microlens of claim 45 wherein the angle is between about 75–89 degrees.

48. The microlens of claim 45 wherein the angle is between about 90–98 degrees.

49. A microlens integrally formed on an optical fiber, the microlens comprising:
a chisel-shaped end of the optical fiber having a chisel edge; and
a Fresnel lens structure formed on the chisel edge.

50. The microlens of claim 49 wherein the Fresnel lens structure comprises a ridge and a valley proximate to the ridge, the ridge having an apex with a first radius of curvature and the valley having a trough with a second radius of curvature, the first radius of curvature being less than the second radius of curvature.

51. The microlens of claim 50 wherein the second radius of curvature is 1.1–1.4 times the first radius of curvature.

52. The microlens of claim 49 wherein the Fresnel lens structure is formed by a binary lens.

53. The microlens of claim 52 wherein the lenslets are binary lenslets transitioning from an apex of a ridge to a trough of a valley in a series of steps.

54. A single-mode optical fiber comprising:
a flat fiber end;
a binary lens formed on the flat fiber end, the binary lens being optically equivalent to an angled chisel lens.

* * * * *